United States Patent [19]

Hirata

[11] Patent Number: 5,784,316
[45] Date of Patent: Jul. 21, 1998

[54] NON-VOLATILE STORAGE DEVICE

[75] Inventor: Masayoshi Hirata, Tokyo, Japan

[73] Assignee: NEC Corporation, Tokyo, Japan

[21] Appl. No.: 753,373

[22] Filed: Nov. 25, 1996

[30] Foreign Application Priority Data

Nov. 24, 1995 [JP] Japan .................................. 7-329960

[51] Int. Cl.⁶ ................................................. G11C 11/34
[52] U.S. Cl. ........................ 365/185.22; 365/185.26; 365/185.29; 365/185.33; 365/218
[58] Field of Search ..................... 365/185.22, 185.26, 365/185.29, 185.33, 218

[56] References Cited

U.S. PATENT DOCUMENTS 5,428,568  6/1995  Kobayashi et al. .............. 365/185.26

FOREIGN PATENT DOCUMENTS 5-54683  3/1993  Japan .

*Primary Examiner*—David C. Nelms
*Assistant Examiner*—Trong Phan

[57] ABSTRACT

Disclosed is an electrically erasable and programmable non-volatile storage device, which has: an erase operation control means for outputting a first signal to write or erase data to or from a memory cell when receiving a write or erase operation signal; a write or erase pulse width control means which decides a write or erase pulse width according to the first signal and outputs a pulse; a write or erase pulse generating means which generates a write or erase pulse to be applied to the memory cell according to the pulse output from the write or erase pulse width control means; a verifying means which decides whether or not the memory cell to which the write or erase pulse is applied reaches a threshold voltage and which outputs the decision as a second signal to the write or erase operation control means; and a write or erase pulse width setting means which outputs a third signal to change the write or erase pulse width on the basis of the first signal and the second signal to the write or erase pulse width control means.

8 Claims, 6 Drawing Sheets

NON-VOLATILE STORAGE DEVICE

FIELD OF THE INVENTION

This invention relates to a non-volatile storage device and more particularly to, an electrically erasable and programmable read-only-memory(hereinafter referred to as 'EEPROM') including a flash-type EEPROM.

BACKGROUND OF THE INVENTION

In EEPROM and a flash-type EEPROM, erasing or writing of data is performed such that a high voltage is applied between the control gate and the source or drain of a memory cell and an electron or hole is injected to the floating gate by the tunnelling phenomenon between the floating gate and the source or drain. In this case, the time required for erasing or writing is a time until the threshold of the memory cell reaches a predetermined value. The time for erasing or writing exponentially increases with the decrease in the electric field between the floating gate and the drain or source.

FIG. 1 shows an example of threshold voltage-erase pulse time characteristic of a flash-type EEPROM. In the erasing in flash-type EEPROM, while the control gate is kept at 0V, around 12V is applied to the source to draw an electron from the control gate. When the threshold of the memory cell is, as shown in case of 5V to 4V in FIG. 1, high, since many electrons exists in the floating gate, the electric field between the floating gate and the source becomes big. Therefore, the erase pulse time is short when the threshold voltage changes. When the threshold of the memory cell is, as shown in case of 1V to 0V in FIG. 1, low, since electron in the floating gate decreases and hole increases, the electric field between the floating gate and the source becomes small. Therefore, the erase pulse time required to change the threshold voltage is long.

As described above, in the erasing or writing in which the tunnelling phenomenon is employed, even when the variation of threshold voltage is constant, the erase pulse time or write pulse time to be required is different depending on the threshold voltage.

Meanwhile, in the flash-type EEPROM with the erasing characteristic as described above, to shorten the time required to verifying(to verify the erased state of memory cell) and the time required to switching between the erase operation mode and the verify mode, a circuit for matching the erase operation with the erasing characteristic is suggested.

For example, Japanese patent application laid-open No.5-54683 discloses a circuit as shown in FIGS. 2 and 3.

Referring to FIG. 2, the circuit comprises an erase operation control circuit 61 for controlling the data erase operation in the memory cell 64 of a flash EEPROM, an erase pulse width control circuit 62 for controlling the accumulated erase pulse width generated by an erase pulse generating circuit 63, the erase pulse generating circuit 63 for generating an erase pulse to erase the data of the cell 64, and a verify circuit 65 for verifying the erased state of the cell 64.

In operation, the erase operation control circuit 61 activates the erase pulse width control circuit 62 when it receives an erase operation signal. Then, the erase pulse width control circuit 62 generates a base pulse and sends it to the erase pulse generating circuit 63, and the erase pulse generating circuit 63 generates an erase pulse corresponding to the base pulse and applies it to the cell 64.

The verify circuit 65 decides whether or not the erasing at the cell 64 satisfies a predetermined value, and if the predetermined value is not satisfied, it outputs an erase operation continuation signal, or if the predetermined value is satisfied, it outputs an erase operation stop signal.

When the erase operation control circuit 61 receives the erase operation continuation signal, it controls the erase pulse width control circuit 62 to perform the next operation, then the erase pulse width control circuit 62 generates a predetermined number of base pulse or a pulse wider than the base pulse and sends it to the erase pulse generating circuit 63. The erase pulse generating circuit 63 generates an erase pulse corresponding to the pulse received from the erase pulse width control circuit 62 and applies it to the cell 64, hereinafter repeating the above operation until when the verify circuit 65 outputs the erase operation stop signal.

As described above, in the first erase operation, the erase pulse sufficient to reach near the predetermined value is generated to erase the cell 64, and in the following operations, the erase pulse is gradually added. Thus, the verify time and the time required to the switching between the erase operation mode and the verify mode can be shortened.

FIG. 3 shows a more detailed composition of the circuit in FIG. 2. Referring to FIG. 3, it comprises a counter circuit 71, a counter selection circuit 72, a plurality of counters 73a to 73i, a base clock generating circuit 74, an erase pulse generating circuit 75, a cell 76, a sense amplifier 77, a verify circuit 78 and a reference potential generating circuit 79.

The operation of the circuit in FIG. 3 will be explained below. Herein, in each of the counters 73a to 73i, a number of repeating the erase operation is previously set. The counter circuit 71 activates the counter selection circuit 72 when it receives an erase operation signal. Then, the counter selection circuit 72 selects the first counter 73a to send the count number retained therein to the base clock generating circuit 74.

The base clock generating circuit 74 generates a base clock with a predetermined time width, the number of which corresponds to the count number received from the counter selection circuit 72, and sends it to the erase pulse generating circuit 75.

The erase pulse generating circuit 75 generates an erase pulse with a predetermined time width, the number of which corresponds to the number of the base clock received from the base clock generating circuit 74, and applies it to a memory cell transistor in the cell 76.

The sense amplifier 77 senses the threshold voltage of the memory cell transistor in the cell 76, then the verify circuit 78 compares the threshold voltage to be sensed by the sense amplifier with a reference potential generated from the reference potential generating circuit 79 which represents the erased state of the memory cell transistor. If the former voltage is higher than the latter voltage, the verify circuit 78 outputs a counter increment signal to the counter circuit 71. If the former voltage is equal to or less than the latter voltage, the verify circuit 78 outputs an erase operation stop signal to the counter circuit 71.

When the counter circuit 71 receives the counter increment signal, it counts up its count value by +1 and sends it to the counter selection circuit 72.

The counter selection circuit 72 selects the second counter 73b to send the count number retained therein to the base clock generating circuit 74. Hereinafter, the above operations are repeated until the verify circuit 78 outputs the erase operation stop signal.

As explained above, in the conventional device, where the erasing characteristic of the flash-type EEPROM is considered, the first erase pulse width is set to be long to some extent, thereafter adding the erase pulse a few times to complete the erasing.

However, in the conventional EEPROM and flash-type EEPROM, since the write pulse or erase pulse is generated with a preset width value, there is a problem that they cannot suitably match with the characteristic that the write or erase time varies when the writing or erasing to EEPROM or flash-type EEPROM is repeated.

Namely, in the early stage of the repeated writing or erasing, since the writing or erasing speed varies to be increased, the writing or erasing time set by the conventional pulse width setting manner will exceed the required time. Particularly in the flash-type EEPROM, when the erasing time becomes too long, the memory cell will be in an over-erase state, therefore requiring a long time to write again thereto.

On the other hand, when the writing or erasing is repeated many times, the required writing or erasing time contrarily becomes long. Therefore, the writing or erasing time set by the conventional pulse width setting manner does not match the required time. As a result, it takes a long time to verify and switch between the write or erase operation mode and verify mode.

SUMMARY OF THE INVENTION

Accordingly, it is an object of the invention to provide a non-volatile storage device in which the time required to verify and switch between the write or erase operation mode and verify mode is shortened.

According to the invention, an electrically erasable and programmable non-volatile storage device, comprises:

an erase operation control means for outputting a first signal to write or erase data to or from a memory cell when receiving a write or erase operation signal;

a write or erase pulse width control means which decides a write or erase pulse width according to the first signal and outputs a pulse;

a write or erase pulse generating means which generates a write or erase pulse to be applied to the memory cell according to the pulse output from the write or erase pulse width control means;

a verifying means which decides whether or not the memory cell to which the write or erase pulse is applied reaches a threshold voltage and which outputs the decision as a second signal to the write or erase operation control means; and a write or erase pulse width setting means which outputs a third signal to change the write or erase pulse width on the basis of the first signal and the second signal to the write or erase pulse width control means.

In the invention, the time required to the writing or erasing of data is detected whenever the write or erase operation is conducted, and when the required write or erase time becomes short, the initial write or erase pulse width is rewritten to be shorter, or when the required write or erase time becomes long, the initial write or erase pulse width is rewritten to be longer. Therefore, corresponding to the variation of write or erase time due to the repetition of writing or erasing, the initial write or erase pulse width which is applied on the first-time of writing or erasing can always be set to be an optimum value. As a result, the time required to verify and switch between the write or erase operation mode and verify mode can be shortened.

BRIEF DESCRIPTION OF THE DRAWINGS

The invention will be explained in more detail in conjunction with the appended drawings, wherein.

DESCRIPTION OF THE PREFERRED EMBODIMENTS

A non-volatile storage device in the first preferred embodiment will be explained in FIG. 4.

Figure 1:
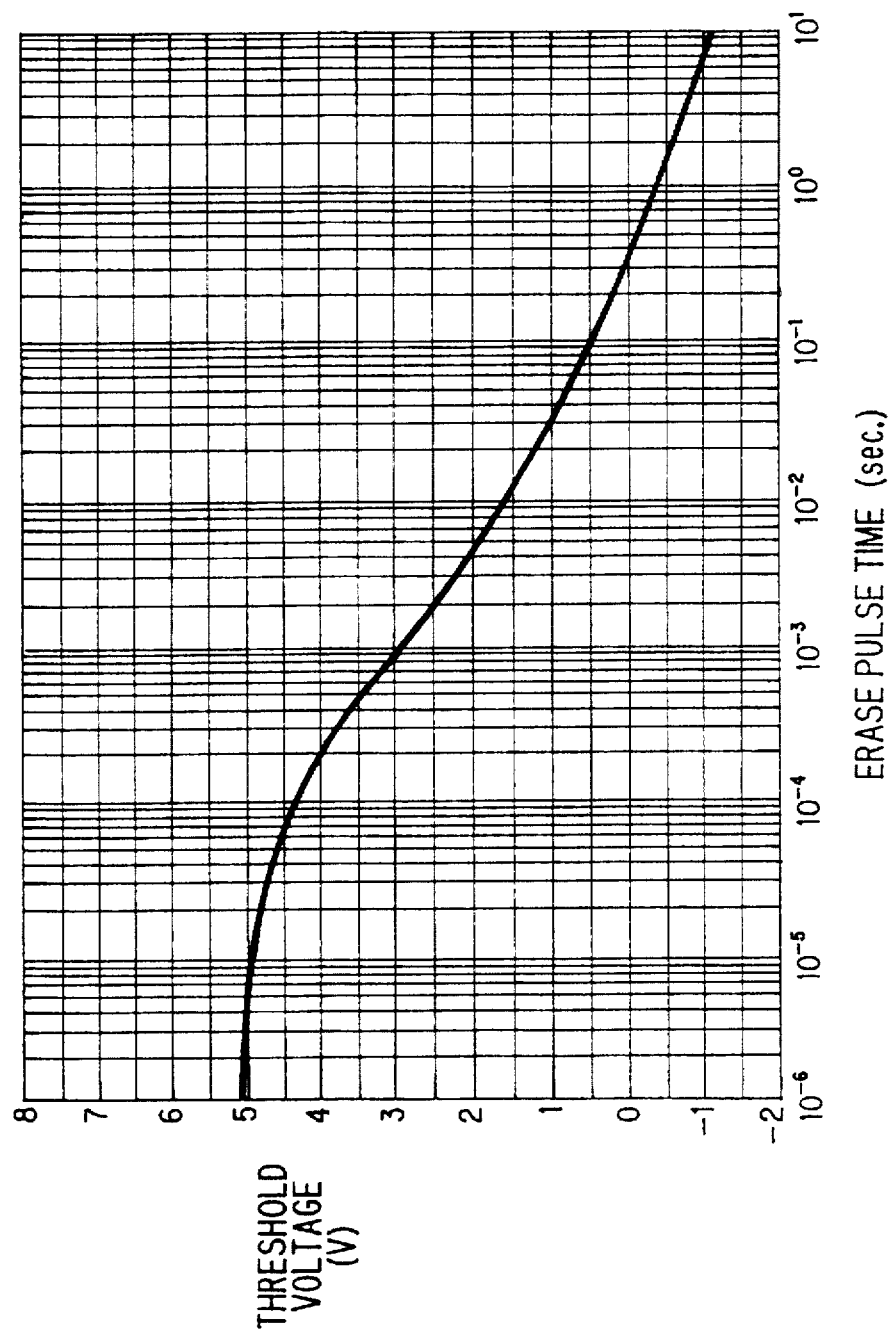
FIG. 1 shows an example of threshold voltage-erase pulse time characteristic of a flash-type EEPROM.
Figure 2:
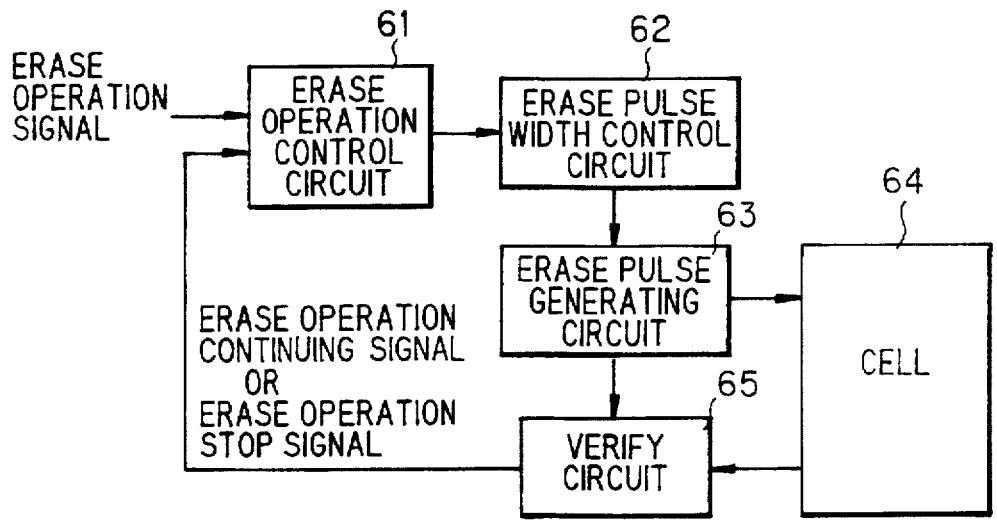
FIG. 2 is a block diagram showing a conventional flash-type EEPROM.
Figure 3:
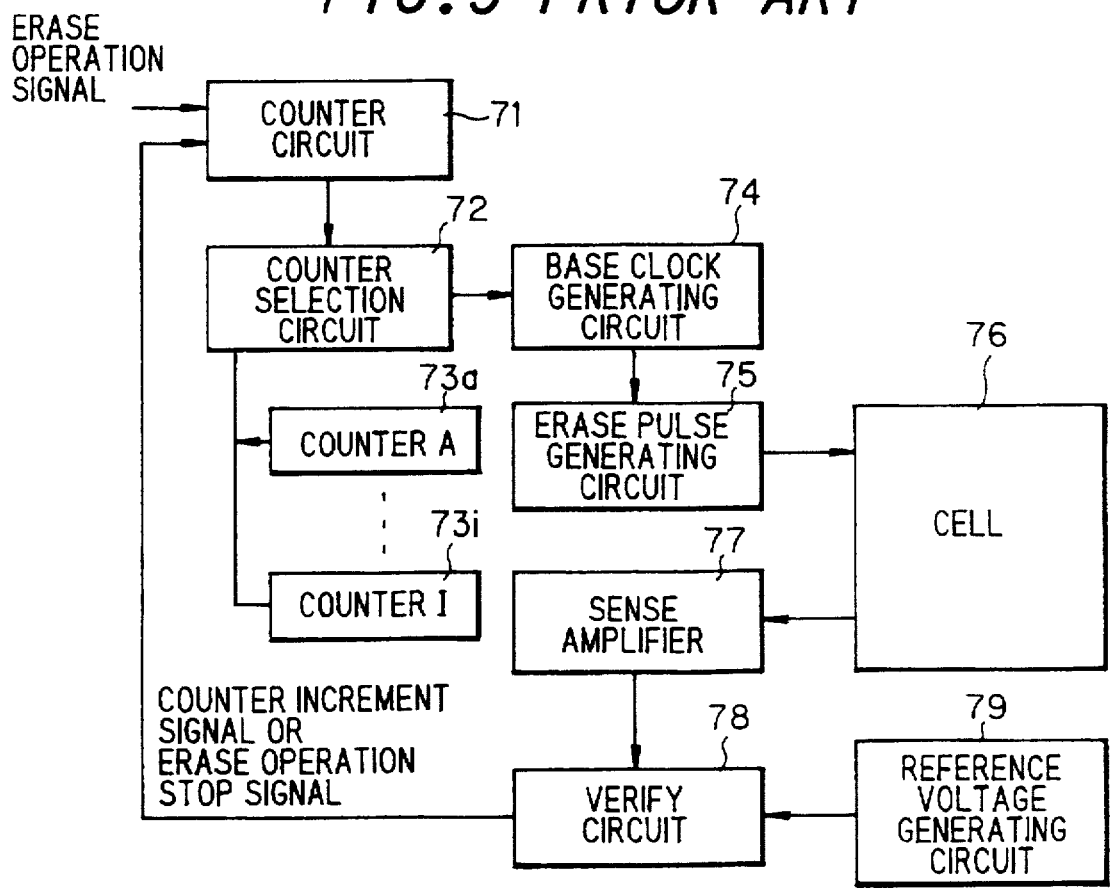
FIG. 3 is a block diagram showing a detailed composition of the conventional flash-type EEPROM in FIG. 2.
Figure 4:
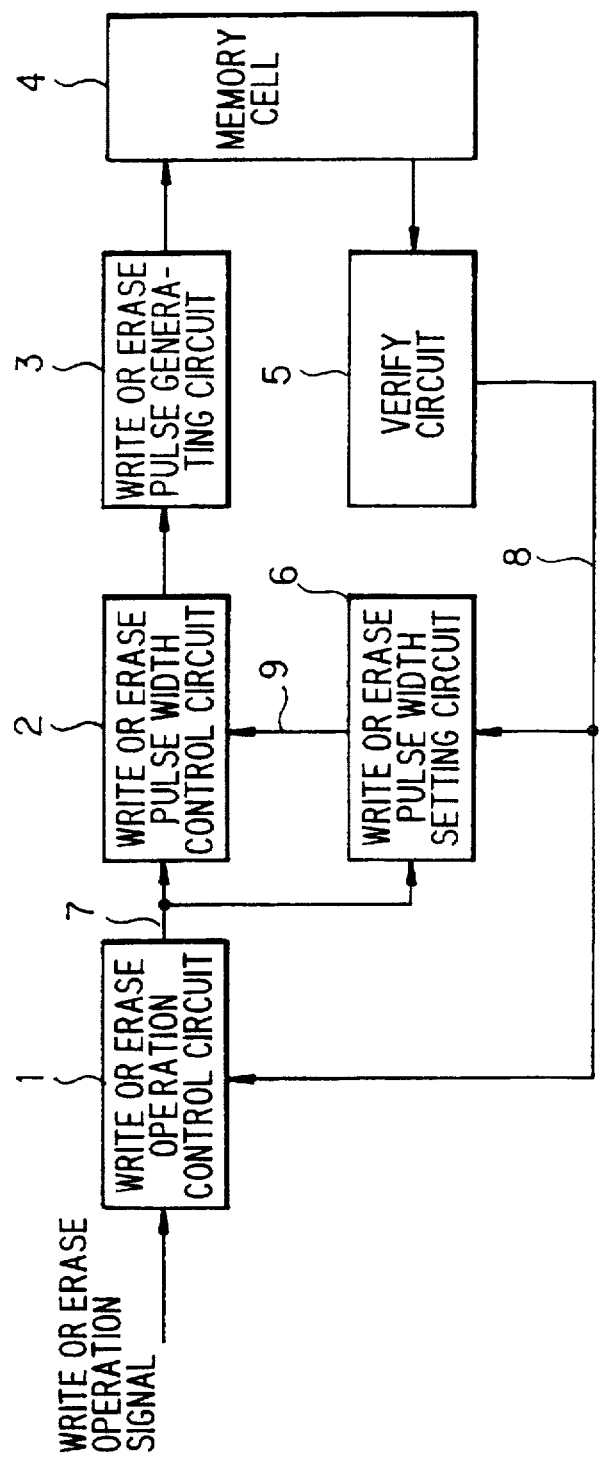
FIG. 4 is a schematic block diagram showing a non-volatile storage device in a first preferred embodiment according to the invention.

Referring to FIG. 4, the non-volatile storage device in the first embodiment comprises a memory cell 4 which includes a memory transistor which has a floating gate, control gate, source and drain, a write or erase operation control circuit 1 which inputs a write or erase operation signal and outputs a control signal 7(hereinafter also referred to as 'first signal') to write or erase data in the memory cell 4, a write or erase pulse width control circuit 2 which determines a write or erase pulse width based on the control signal 7 from the write or erase operation control circuit 1 and outputs a pulse to a write or erase pulse generating circuit 3 which generates a write or erase pulse applied to the memory cell 4 responding to the pulse from the write or erase pulse width control circuit 2, and a verify circuit 5 which decides whether or not the memory cell 4 where the write or erase pulse is applied reaches a predetermined threshold voltage and which outputs the decision as a signal 8 (hereinafter also referred to as 'second signal') to the write or erase operation control circuit 1 and to a write or erase pulse width setting circuit 6, wherein the write or erase pulse width setting circuit 6 inputs the signal 7 and signal 8 and outputs a signal 9 (hereinafter also referred to as 'third signal') for changing the write or erase pulse width to the write or erase pulse width control circuit 2.

The signal 7 is used as the first-time control signal for write or erase operation. If the memory cell 4 reaches the predetermined threshold voltage, the signal 8 output from the verify circuit 5 stops the operation of the write or erase operation control circuit 1, and the write or erase pulse width setting circuit 6 outputs the signal 9 to shorten the write or erase pulse width to the write or erase pulse width control circuit 2.

On the other hand, if the memory cell 4 does not reach the predetermined threshold voltage, the signal 8 output from the verify circuit 5 continues the operation of the write or erase operation control circuit 1. The write or erase operation control circuit 1 outputs the signal 7 as the second-time control signal for write or erase operation, where the signal 7 is used as the second-time and after control signal for write or erase operation. Then, if the memory cell 4 reaches the predetermined threshold, the signal 8 stops the operation of the write or erase operation control circuit 1 to terminate the write or erase operation.

Meanwhile, if the memory cell 4 does not reach the predetermined threshold voltage, the signal 8 continues the write or erase operation and the write or erase pulse width setting circuit 6 outputs the signal 9 to lengthen the first-time write or erase pulse width to the write or erase pulse width control circuit 2.

Figure 5:
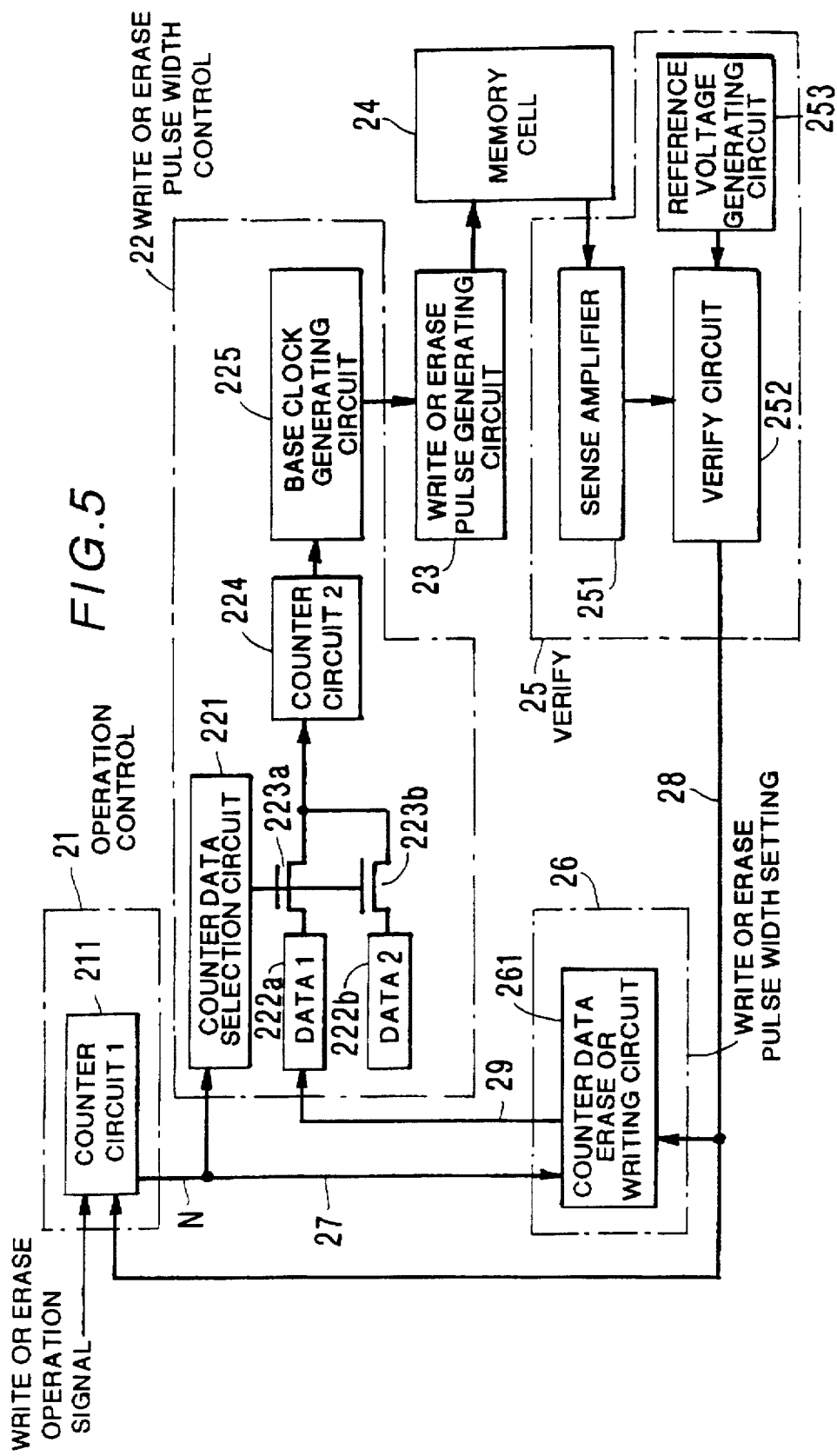
FIG. 5 is a detailed block diagram showing the non-volatile storage device in the first embodiment.

FIG. 5 shows a detailed composition of the non-volatile storage device in the first embodiment in FIG. 4.

Referring to FIG. 5, a write or erase operation control circuit 21 comprises a first counter circuit 211, and a write or erase pulse width control circuit 22 comprises a counter data selection circuit 221, first counter data 222a, second counter data 222b, a second counter circuit 224, first and second N-type enhancement MOS transistors 223a, 223b which are located between the first and second counter data 222a, 222b and the second counter circuit 224, and a base clock generating circuit 225. Based on the output of the base clock generating circuit 225, a write or erase pulse generating circuit 23 outputs a pulse with a predetermined pulse width to a memory cell 24.

Further, a verify circuit 25 comprises a sense amplifier 251, a verify circuit 252 and a reference potential generating circuit 253, and a write or erase pulse width setting circuit 26 includes a counter data erasing or writing circuit 261.

In operation, a write or erase operation signal is input to the first counter circuit 211. Then, the first counter circuit 211 resets the counter, thereafter sending a signal N which indicates the N-time write or erase operation as the first signal to the counter data selection circuit 221. Namely, at first, N=1, which indicates the first-time write or erase operation.

When the counter data selection circuit 221 receives the signal N, in case of N=1, it sends the first counter data 222a which stores the initial data of write or erase pulse width to the second counter circuit 224 by selecting the N-type MOS transistor 223a.

In case of N≧2, it sends the second counter data 222b which stores additional data of write or erase pulse width to the second counter circuit 224 by selecting the N-type MOS transistor 223b.

The second counter circuit 224 transfers the received counter data signal to the base clock generating circuit 225.

The base clock generating circuit 225 outputs pulses of a number corresponding to the data from the second counter circuit to the write or erase pulse generating circuit 23, then the write or erase pulse width generating circuit 23 applies the write or erase pulse to the memory cell 24.

After applying the pulse by the write or erase pulse generating circuit 23, the sense amplifier 251 reads out the data in the memory cell 24 and sends it to the verify circuit 252 to compare it with data sent from the reference potential generating circuit 253.

Here, if the data from the sense amplifier 251 coincides with the data from the reference potential generating circuit 253, the verify circuit 252 outputs a write or erase operation stop signal as the second signal to the first counter circuit 211 and counter data writing circuit 26. To the contrary, if not so, the verify circuit 252 outputs a counter increment signal as the second signal to the first counter circuit 211 and counter data erasing or writing circuit 261.

When the counter data erasing or writing circuit 261 receives the write or erase operation stop signal, in case of N=1 in the signal N from the first counter circuit 211, it transfers a pulse width data rewrite signal as the third signal to shorten the initial write or erase pulse data to the first counter data 222a, and, in case of N≧2, it does nothing.

On the other hand, when the counter data erasing or writing circuit 261 receives the counter increment signal, in case of N=1 in the signal N from the first counter circuit 211, it does nothing, and, in case of N≧2, it transfers a pulse width data rewrite signal as the third signal to lengthen the initial write or erase pulse data to the first counter data 222a.

Meanwhile, when the first counter circuit 211 receives the write or erase operation stop signal, it stops the counter operation to terminate the write or erase operation.

When the first counter circuit 211 receives the counter increment signal, it counts up its count value by +1 and sends the count-up result as the signal N to the counter data selection circuit 221 and counter data erasing or writing circuit 261, thereafter continuing the operation until the write or erase operation stop signal is transferred from the verify circuit 252 to the first counter 211.

Figure 6:
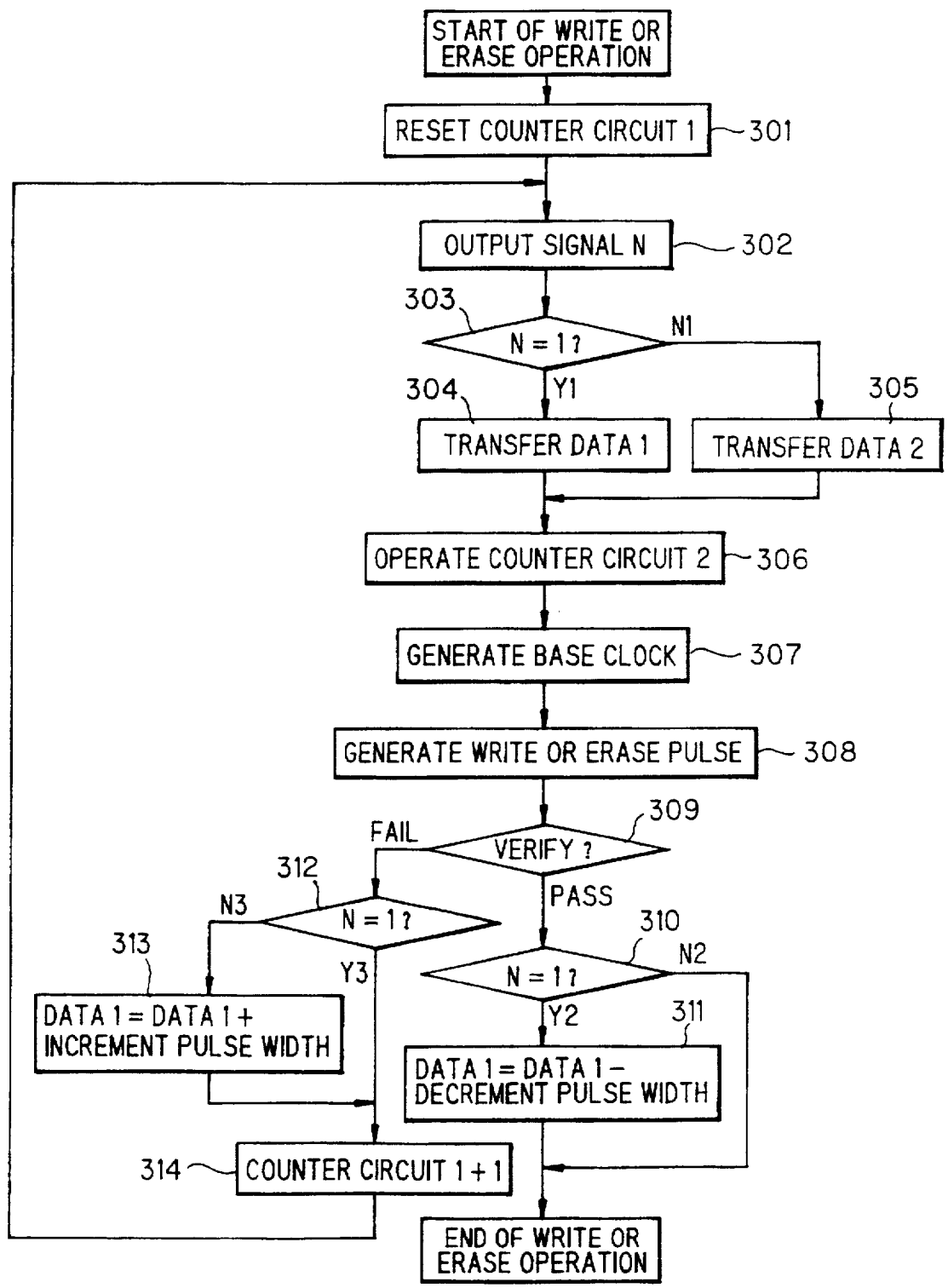
FIG. 6 is a flow chart for explaining the operation in the first embodiment.

FIG. 6 shows a flow chart for explaining the operation in the first embodiment. First, receiving the write or erase operation signal, the first counter circuit 211 resets its counter(Step 301), then it outputs the signal N to the counter data selection circuit 221(Step 302). Here, at the beginning, the signal N is of N=1 and subsequently is counted up.

Then, the counter data selection circuit 221 decides whether the signal N is of N=1 or not(Step 303), in case of N=1, it transfers the initial write or erase pulse width data stored in the first counter data 222a to the second counter circuit 224(Step 304), and, in case of N≠1, it transfers the additional write or erase pulse width data stored in the second counter data 222b to the second counter circuit 224(Step 305).

Receiving the data, the second counter circuit 224 generates pulses and transfers the number of pulses corresponding to the received data to the base clock generating circuit 225(Step 306).

Then, the base clock generating circuit 225 generates a pulse which has the minimum write or erase pulse length preset for the writing or erasing, respectively, corresponding to each of the pulse sent from the second counter circuit 224, then transferring it to the write or erase generating circuit 252(step 307).

The write or erase generating circuit 252 applies a voltage to the memory cell 24, according to the pulse length generated by the base clock generating circuit 225(Step 308).

Next, the verify circuit 25 decides whether the data reaches an expected value(Step 309). If reaching the expected value, then the process is proceeded into 'PASS' step as shown to output the write or erase operation stop signal, and, if not reaching the expected value, then the process is proceeded into 'FAIL' step as shown.

In the PASS step, the counter data erasing or writing circuit 261 decides whether the signal N is of N=1 or not(step 310), and, in case of N=1(Refer to branch Y2 of Step 310), which indicates that the initial pulse width is sufficient to complete the writing or erasing, it transfers a signal to decrease by a decrement pulse width in the initial write or erase pulse width data of the first counter data 222a to the first counter data 222a(step 311), considering the over-erase state particularly in the erasing. On the other hand, in case of N≠1(Refer to branch N2 of Step 310), it does nothing and the write or erase operation is terminated.

In the FAIL step, the counter data erasing or writing circuit 261 decides whether the signal N is of N=1 or not(Step 312), and, in case of N=1(Refer to branch Y3 of Step 312), it does nothing and the count value of the first counter circuit 211 is counted up by +1(Step 314). In case of N≠1, i.e., N≧2(Refer to branch N3 of Step 312), which indicates that the initial pulse width is insufficient to complete the writing or erasing, it transfers a signal to increase by an increment pulse width in the initial write or erase pulse width data of the first counter data 222a to the first counter data 222a(Step 313). Thereafter, the count value of the first counter circuit 211 is counted up by +1(Step 314), then returning to Step 302 for outputting the signal N.

A non-volatile storage device in the second preferred embodiment will be explained in FIG. 7.

Figure 7:
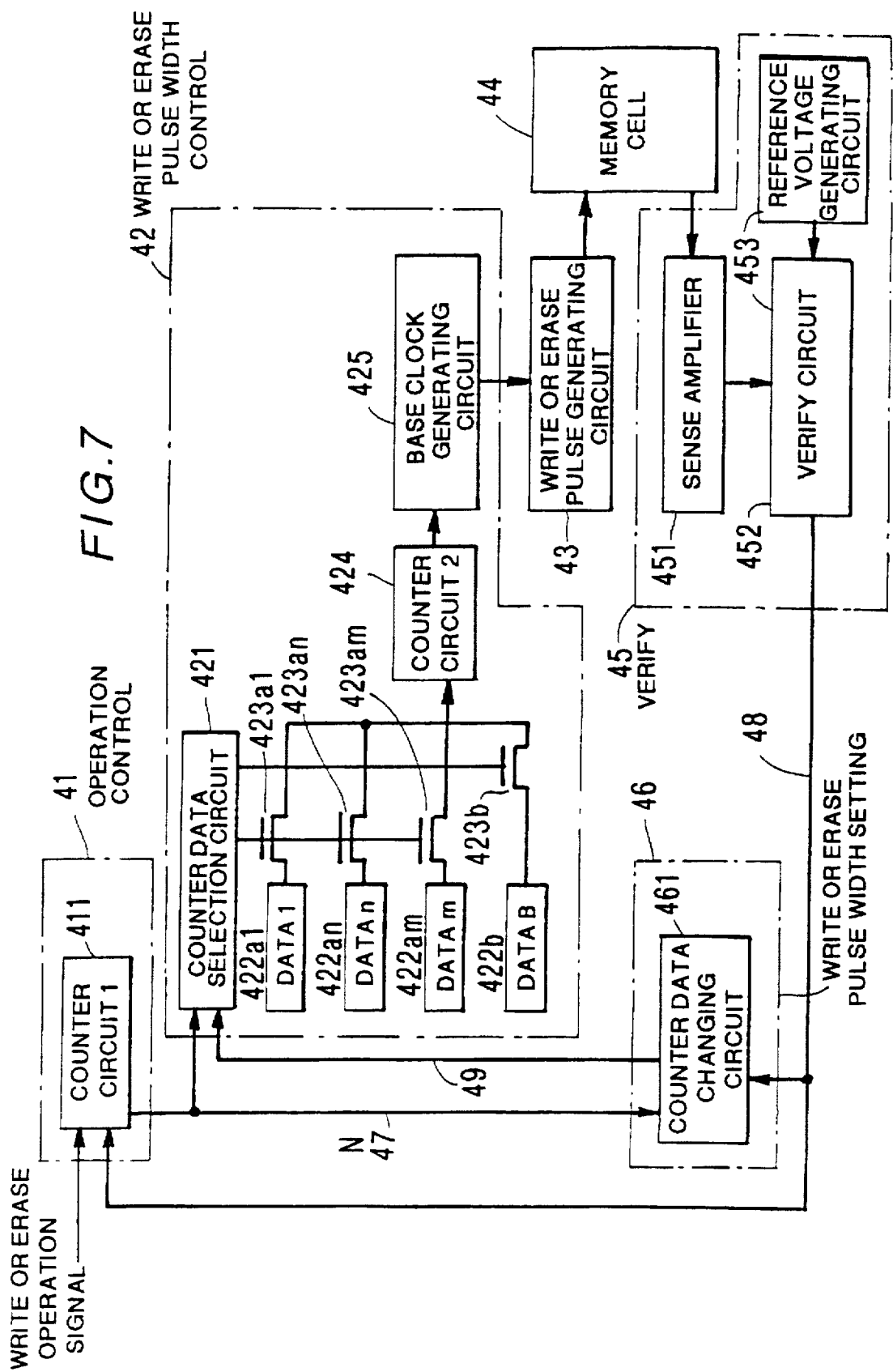
FIG. 7 is a block diagram showing a non-volatile storage device in a second preferred embodiment according to the invention.

In the second embodiment, comparing to the first embodiment, only the write or erase pulse width control circuit 22 in the first embodiment as shown in FIG. 5 is modified as a write or erase pulse width control circuit 42 in FIG. 7. Therefore, only the composition and operation of the write or erase pulse width control circuit 42 will be explained below.

The write or erase pulse width control circuit 42 comprises a counter data selection circuit 421, counter data 422a1 to 422am, a counter data B 422b, N-type enhancement MOS transistors 423a1 to 423am and N-type enhancement MOS transistor 423b, a second counter circuit 424, and a base clock generating circuit 425.

In operation, when the counter data selection circuit 421 receives a signal N47, in case of N=1, it sends one of data 1 to m which stores the initial write or erase pulse width data to the second counter circuit, 424 by selecting one of the N-type enhancement MOS transistors 423a1 to 423am.

For example, data n is selected. This selection is controlled by a non-volatile semiconductor storage which is provided in the counter data selection circuit 421 and stores which of the N-type enhancement MOS transistors 423a1 to 423am should be selected.

In case of N≧2, the counter data selection circuit 421 sends data B 422b which stores additional write or erase pulse width data to the second counter circuit 424 by selecting the N-type enhancement MOS transistors 423b.

Here, the process from the second counter circuit 424 to the output of the third signal 49 from a counter data changing circuit 461 is similar to that in the first embodiment, therefore the explanation thereof is omitted.

When the counter data selection circuit 421 receives the signal 49 as the third signal to shorten the initial write or erase pulse width data, it change the selection of data n and rewrite the content of the above semiconductor storage to select, for example, data (n−1).

On the other hand, When the counter data selection circuit 421 receives the signal 49 as the third signal to lengthen the initial write or erase pulse width data, it change the selection of data n and rewrite the content of the above semiconductor storage to select, for example, data (n+1).

Here, the pulse width data has a relation of data(n−1) <data n<data(n+1).

As described above, the selection of the write or erase pulse width data can be changed.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An electrically erasable and programmable non-volatile storage device, comprising:

an erase operation control means for outputting a first signal to write or erase data to or from a memory cell when receiving a write or erase operation signal;

a write or erase pulse width control means which decides a write or erase pulse width according to said first signal and outputs a pulse;

a write or erase pulse generating means which generates a write or erase pulse to be applied to said memory cell according to said pulse output from said write or erase pulse width control means;

a verifying means which decides whether or not said memory cell to which said write or erase pulse is applied reaches a threshold voltage and which outputs the decision as a second signal to said write or erase operation control means; and a write or erase pulse width setting means which outputs a third signal to change said write or erase pulse width on the basis of said first signal and said second signal to said write or erase pulse width control means.

2. An electrically erasable and programmable non-volatile storage device, according to claim 1, wherein:

when said first signal is a first-time control signal for write or erase operation, and when said memory cell reaches said threshold voltage, said second signal controls to stop said write or erase operation control means and said write or erase pulse width setting means outputs said third signal to shorten said write or erase pulse width to said write or erase pulse width control means, and when said memory cell does not reach said threshold voltage, said second signal continues the operation of said write or erase operation control means and said write or erase operation control means outputs a second-time control signal for write or erase operation to operate as said first signal; and when said second-time control signal for write or erase operation operates as said first signal, and when said memory cell reaches said threshold voltage, said second-time signal operates to stop said write or erase operation control means, and when said memory cell does not reach said threshold voltage, said second-time signal continues the operation of said write or erase operation control means, and said write or erase pulse width setting means outputs said third signal to said write or erase pulse width control means to lengthen said first-time write or erase pulse width.

3. An electrically erasable and programmable non-volatile storage device, according to claim 1, wherein:

write or erase pulse width setting means provided in said write or erase pulse width control means comprises a storage means for storing said write or erase pulse width and means for rewriting a stored pulse width in said storage means into a pulse width a little shorter than a pulse width necessary to an actual write or erase operation according to said third signal.

4. An electrically erasable and programmable non-volatile storage device, according to claim 2, wherein:

write or erase pulse width setting means provided in said write or erase pulse width control means comprises a storage means for storing said write or erase pulse width and means for rewriting a stored pulse width in said storage means into a pulse width a little shorter than a pulse width necessary to an actual write or erase operation according to said third signal.

5. An electrically erasable and programmable non-volatile storage device, according to claim 1, wherein:

write or erase pulse width setting means provided in said write or erase pulse width control means comprises a plurality of storage means for storing said write or erase pulse width, a storage means for storing a selection signal to select one of said plurality of storage means and means for rewriting a stored pulse width in said storage means into a pulse width a little shorter than a pulse width necessary to an actual write or erase operation according to said third signal.

6. An electrically erasable and programmable non-volatile storage device, according to claim 2, wherein:

write or erase pulse width setting means provided in said write or erase pulse width control means comprises a plurality of storage means for storing said write or erase pulse width, a storage means for storing a selection signal to select one of said plurality of storage means and means for rewriting a stored pulse width in said storage means into a pulse width a little shorter than a pulse width necessary to an actual write or erase operation according to said third signal.

7. An electrically erasable and programmable non-volatile storage device, according to claim 3, wherein:

said storage means includes an electrically erasable and programmable non-volatile semiconductor memory cell.

8. An electrically erasable and programmable non-volatile storage device, according to claim 4, wherein:

said storage means includes an electrically erasable and programmable non-volatile semiconductor memory cell.

* * * * *